United States Patent Office 3,454,400

Patented July 8, 1969

3,454,400

LIGHT-SENSITIVE NAPHTHOQUINONE DIAZIDE ESTER COMPOUNDS AND PRINTING PLATES MADE THEREFROM

Frank E. Smith, Hanger Hill, England, assignor to Algraphy Limited, London, England, a British company No Drawing. Filed Aug. 3, 1965, Ser. No. 477,034
Claims priority, application Great Britain, Aug. 5, 1964, 31,847/64
Int. Cl. G03c *1/52;* C07c *113/00*
U.S. Cl. 96—91 10 Claims

ABSTRACT OF THE DISCLOSURE

The invention relates to light sensitive materials which contain condensation products of naphthoquinone-(1,2)-diazide-(2)-5-sulphonyl chloride with an aromatic monohydroxycarboxylic ester as the essential ingredient thereof and to printing plates containing said light sensitive materials.

This invention relates to positive-working lithographic printing plates, i.e. where the printing plate is made from a positive image or pattern but may be used to give a positive resist for bi- or tri-metal printing plates or process engraving. Sus has described (Annalen der Chemie 556, 65 (1944)) how the diazo oxides of various aromatic compounds on exposure to light, give ketene intermediates that in the presence of water immediately give rise to carboxylic acids soluble in alkali. Thus if a layer of such a derivative is coated on to a suitable base and then exposed to light through a pattern the exposed portion is rendered soluble in aqueous alkali and may be removed from the unexposed areas which remain on the plate. With those derivatives which are oleophilic these areas may be inked for lithographic printing purposes. (Cf. specification 699,412.)

The present invention provides compounds which are characterised by good ink receptivity and high sensitivity to light and therefore require short exposure time of the printing plates made from them.

According to the present invention a light sensitive material for the photomechanical production of printing plates comprises a support and a light sensitive layer thereon provided from a condensation product of naphthoquinone-(1,2)-diazide-(2)-5-sulphonyl chloride, with an aromatic hydroxy carboxylic ester of a type which when exposed to ultraviolet radiation will re-arrange to give a benzophenone as exemplified by resorcinol monobenzoate re-arranging to hydroxy benzophenone.

The esters may be prepared by conventional condensation methods such as treatment of a solution of the hydroxy compound and the acid chloride in a mutual solvent with an alkali or organic base. Thus, for example, 43 gm. of resorcinol monobenzoate may be dissolved in 600 ml. dioxan followed by the addition of 54 gm. naphthoquinone-(1,2)-diazide-(2)-5-sulphonyl chloride. The mixture is stirred at 20° C. and 300 ml. 10% solution of sodium carbonate is added over a period of one hour, whereupon the solution is heated and stirred at 40° C. for 30 minutes and then poured with stirring into 4 l. water containing 40 ml. hydrochloric acid 37%. After standing overnight, the precipitate is collected by suction, washed with water until neutral and dried at 45° C. to give 67 gm. yellowish brown powder M.P. 136° C.

Instead of resorcinol monobenzoate other starting materials for derivatives prepared similarly are, inter alia, as follows (all give a yellow derivative):

| | M.P. |
|---|---|
| Phenyl salicylate | 144° C. |
| p-Octylphenyl salicylate | 133° C. |
| 4-tertiary butyl phenyl salicylate | 134° C. |

The invention includes the manufacture of printing plates in which the light-sensitive compounds hereinbefore described, are coated on to conventional supports, e.g. aluminium (which may have a modified, e.g. anodised surface), paper, or zinc plates by means of their solutions in organic solvents, and then treated in known manner by exposure to light under a pattern, development by the removal of the light struck areas by means of an alkaline solution, treatment of the plate with a lithographic desensitiser, and inking of the image by means of a greasy ink or an equivalent process familiar to those skilled in the art. Another feature of the invention is that the image may be used as a resist in etching processes; these may require the use of a negative pattern to give a positive printing plate.

The light-sensitive compounds of the invention occur as amorphous solids. This is an advantage as when the plate is made, its printing quality is seriously reduced if the compound crystallises, thereby forming an uneven coating. It has been found that it may be advantageous in some cases to have present in the coating an alkali soluble resin. This may improve the ink receptivity of the image on the plate. A fatty acid such as stearic may be used for the same purpose. A dye may be added to the coating solution, if desired, so as to render the image more visible, particularly during development.

EXAMPLE 1

An anodised aluminium plate is coated in a whirler rotating at 150 r.p.m. with a solution of 2% of the naphthoquinone-(1,2)-diazide-(2)-5-sulphonyl ester of resorcinol monobenzoate in ethylene glycol monomethyl ether and when dry is exposed for one minute under a positive pattern to the light from an arc lamp. The exposed plate is developed by swabbing with 3% aqueous solution of trisodium phosphate, rinsed with water, swabbed with acid gum solution, and inked up in the usual way to give a printing plate for use in offset lithography.

EXAMPLE 2

An anodised aluminium plate is coated in a whirler rotating at 150 r.p.m. with a solution of 2% of the naphthoquinone-(1,2)-diazide-(2)-5-sulphonyl ester of p-octylphenyl salicylate (M.P. 133° C.) in ethylene glycol monomethyl ether and when dry is exposed for one minute under a positive pattern to the light from an arc lamp. The exposed plate is developed by swabbing with 3% aqueous solution of trisodium phosphate, rinsed with water, swabbed with acid gum solution, and inked up in the usual way to give a printing plate for use in offset lithography.

EXAMPLE 3

The procedure of Example 1 is followed except that the coating solution is 1% of the light-sensitive material with 1% Resin R.17315, a novolak produced by Bakelite, Ltd. A satisfactory printing plate is the result.

EXAMPLE 4

The procedure of Example 2 is followed but using 1% novolak with 1% sensitizer to obtain a satisfactory printing plate.

EXAMPLE 5

Comparison of exposure speeds

Plates are prepared as in Example 1 using solutions containing 1% novolak resin and 1% respectively of the sulphonic esters of 2,3,4-trihydroxy benzophenone, resorcinol monobenzoate, and p-octylphenyl salicylate. The ester of 2,3,4-trihydroxy benzophenone was chosen for comparison of speed because it appears to be the preferred example of British patent specification No. 739,654 which describes and claims light sensitive material for photomechanical production of printing plates which are said to give aluminium plates or foils which differ from previously known products by their greater sensitivity to light. The three plates are exposed under a Kodak Photographic Step Tablet No. 3 so that when processed as described above the finished plate shows the first signs of taking ink on the second step. The exposure is carried out by means of a 45 volt, 50 amp. open carbon arc lamp at a distance of 3 feet. The respective times of exposure needed are 30, 15 and 15 seconds. When similar plates are exposed under a conventional screened positive design and the plates obtained are submitted to a wear test on a printing machine, all give the same estimated printing life which is that expected for printing plates based on this type of coating.

I claim:

1. Printing plates comprising a support and a light sensitive layer thereon, said light sensitive layer comprising a condensation product of naphthoquinone-(1,2)-diazide-(2)-5-sulfonyl chloride with an aryl ester of an aryl monocarboxylic acid wherein a single hydroxy group is attached to only one of the aryl radicals and of the type which when exposed to ultraviolet radiation will rearrange to give a benzophenone having a hydroxy group, said condensation product retaining the carboxylic ester linkage of the aromatic hydroxy carboxylic ester compound prior to exposure to ultraviolet light.

2. Printing plates as claimed in claim 1 wherein the aromatic hydroxy ester is an ester of resorcinol monobenzoate.

3. Printing plates as claimed in claim 1 wherein the aromatic hydroxy ester is an ester of phenyl salicylate.

4. Printing plates as claimed in claim 1 wherein the aromatic hydroxy ester is an ester of p-octylphenyl salicylate.

5. Printing plates as claimed in claim 1 wherein the aromatic hydroxy ester is an ester of 4-tertiary butyl phenyl salicylate.

6. A light sensitive material for the photomechanical production of printing plates comprising a condensation product of naphthoquinone-(1,2)-diazide-(2)-5 sulfonyl chloride with an aryl ester of an aryl monocarboxylic acid wherein a single hydroxy group is attached to only one of the aryl radicals and also of the type which, when exposed to ultraviolet radiation, will rearrange to give a benzophenone having a hydroxyl group, said condensation product retaining the carboxylic ester linkage of the aromatic hydroxy carboxylic ester compound prior to exposure to ultraviolet light.

7. A light sensitive material as claimed in claim 6 wherein the aromatic hydroxy ester is an ester of resorcinol monobenzoate.

8. A light sensitive material as claimed in claim 6 wherein the aromatic hydroxy ester is an ester of phenyl salicylate.

9. A light sensitive material as claimed in claim 6 wherein the aromatic hydroxy ester is an ester of p-octylphenyl salicylate.

10. A light sensitive material as claimed in claim 6 wherein the aromatic hydroxy ester is an ester of 4-tertiary butyl phenyl salicylate.

References Cited

UNITED STATES PATENTS

| | | |
|---|---|---|
| 3,106,465 | 10/1963 | Neugebauer et al. |
| 3,130,048 | 4/1964 | Fritz et al. |
| 3,201,239 | 8/1965 | Neugebauer et al. |

NORMAN G. TORCHIN, *Primary Examiner.*

C. BOWERS, *Assistant Examiner.*

U.S. Cl. X.R.

96—33, 75; 260—141